US007327506B2

(12) United States Patent
Yui

(10) Patent No.: US 7,327,506 B2

(45) Date of Patent: Feb. 5, 2008

(54) CORRECTION CIRCUIT

(75) Inventor: Hideaki Yui, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 451 days.

(21) Appl. No.: 11/156,656

(22) Filed: Jun. 21, 2005

(65) Prior Publication Data

US 2005/0286062 A1 Dec. 29, 2005

(30) Foreign Application Priority Data

Jun. 29, 2004 (JP) ............................ 2004-191824
Jun. 6, 2005 (JP) ............................ 2005-165552

(51) Int. Cl.
*G03F 3/10* (2006.01)

(52) U.S. Cl. ...................... 358/527; 358/1.9; 358/521; 358/1.16; 382/282; 382/299

(58) Field of Classification Search ................ 358/527, 358/1.16, 521, 1.9; 382/282, 299
See application file for complete search history.

(56) References Cited

U.S. PATENT DOCUMENTS

| | | | | |
|---|---|---|---|---|
| 5,734,361 | A | 3/1998 | Suzuki et al. | 345/74 |
| 6,307,327 | B1 | 10/2001 | Xie et al. | 315/169.4 |
| 6,489,938 | B1 | 12/2002 | Ito | 345/63 |
| 6,580,407 | B1 | 6/2003 | Suzuki et al. | 345/74.1 |
| 6,603,450 | B1 | 8/2003 | Yamazaki et al. | 345/75.2 |
| 6,712,660 | B2 | 3/2004 | Aoki et al. | 445/3 |
| 6,842,160 | B2 | 1/2005 | Yamazaki et al. | 345/76 |
| 6,888,519 | B2 | 5/2005 | Yamano et al. | 345/75.2 |
| 6,890,229 | B2 | 5/2005 | Aoki et al. | 445/3 |
| 7,046,219 | B2 | 5/2006 | Kanai et al. | 345/75.2 |
| 2002/0167503 | A1 | 11/2002 | Tsunoda et al. | 345/204 |
| 2003/0107542 | A1 | 6/2003 | Abe et al. | 345/89 |
| 2005/0030263 | A1 | 2/2005 | Yamazaki | 345/75.1 |
| 2005/0105001 | A1 | 5/2005 | Yui et al. | 348/441 |
| 2005/0114901 | A1 | 5/2005 | Yui et al. | 725/100 |
| 2005/0125819 | A1 | 6/2005 | Ono et al. | 725/14 |
| 2005/0285543 | A1 | 12/2005 | Yui et al. | 315/169.4 |
| 2006/0132394 | A1 | 6/2006 | Hayama et al. | 345/74.1 |

FOREIGN PATENT DOCUMENTS

| | | |
|---|---|---|
| JP | 11-24629 | 1/1999 |
| JP | 11-250839 | 9/1999 |
| JP | 11-250840 | 9/1999 |
| JP | 2000-250463 | 9/2000 |
| JP | 2001-13482 | 1/2001 |
| JP | 2003-29697 | 1/2003 |

*Primary Examiner*—Kimberly Williams
*Assistant Examiner*—Michael Burleson
(74) *Attorney, Agent, or Firm*—Fitzpatrick, Cella, Harper & Scinto

(57) ABSTRACT

A correction circuit for correcting pixel signals, comprising:

a first memory for storing signals obtained by executing decimation process;

a calculating circuit for calculating a correction value based on an output from the first memory;

a second memory for adjusting a timing of output of the correction; and an operating circuit for operating to correct the image signal, wherein the correction value has a value corresponding to a suppressing amount for which an influence on display gradation of the predetermined pixel by the plurality of peripheral pixels is suppressed, and wherein the suppressing is caused by a shielding member possessed by a display panel for displaying images by pixel signal.

13 Claims, 11 Drawing Sheets

CORRECTION CIRCUIT

BACKGROUND OF THE INVENTION

1. Field of the Invention

The present invention relates to a correction circuit for correcting a driving signal of an image display apparatus.

2. Description of the Related Art

U.S. Pat. No. 6,307,327 (Motorola, Inc. Method for controlling spacer visibility) discloses, as a method of controlling spacer visibility in electric field emission display, a pixel data correction method of defining a first region near a space and a second region remote from the spacer, and correcting pixel data to be transmitted to the first region depending on an intensity level of a light generated by a plurality of pixels in the first region near the spacer so that the spacer is not visible from a viewer.

SUMMARY OF THE INVENTION

However, in the case of correcting in consideration of an influential range of over a plurality of pixels of n pixels×n lines, a huge quantity of memory is needed to determine correction values, and the cost is much increased.

It is hence an object of the invention to realize a configuration capable of reducing the cost of a correction circuit by determining correction values by a small quantity of memory without lowering the correction performance.

In order to achieve the object, the invention employs the following configuration, that is, a correction circuit for correcting pixel signals, comprising:

a first memory for storing signals obtained by executing decimation process to a plurality of pixel signals sequentially inputted as pixel signals corresponding to a plurality of peripheral pixels positioned in the vicinity of a predetermined pixel on a predetermined screen;

a calculating circuit for calculating a correction value based on an output from the first memory;

a second memory for adjusting a timing of output of the correction value so as to correct a pixel signal which is for forming the predetermined pixel on a screen after the predetermined screen and which does not pass through the first memory, by the correction value corresponding to the predetermined screen; and an operating circuit for operating to correct the pixel signal which is for forming the predetermined pixel on a screen after the predetermined screen and which does not pass through the first memory, by the correction value corresponding to the predetermined screen, wherein the correction value has a value corresponding to a suppressing amount for which an influence on display gradation of the predetermined pixel by the plurality of peripheral pixels is suppressed, and wherein the suppressing is caused by a shielding member possessed by a display panel for displaying images by pixel signal.

The invention further provides a correction circuit for correcting pixel signals, comprising:

a first memory for storing signals obtained by executing decimation process to a plurality of pixel signals sequentially inputted as pixel signals corresponding to a plurality of peripheral pixels positioned in the vicinity of a predetermined pixel on a predetermined screen;

a calculating circuit for calculating a correction value based on an output from the first memory, wherein said correction value has a value for correcting an influence on display gradation of the predetermined pixel by the plurality of peripheral;

a second memory for adjusting a timing of outputting the correction value so as to correct a pixel signal which is for forming the predetermined pixel on a screen after the predetermined screen and which does not pass through the first memory, by the correction value corresponding to the predetermined screen; and an operating circuit for operating to correct the pixel signal which is forming the predetermined pixel on a screen after the predetermined screen and which does not pass through the first memory, by the correction value corresponding to the predetermined screen.

According to the invention, without lowering the correction performance, the correction value can be determined by a small memory quantity, so that the cost of the correction circuit can be saved.

DETAILED DESCRIPTION OF THE PREFERRED EMBODIMENTS

Preferred embodiments of the invention will be specifically described below with reference to the accompanying drawings. Unless otherwise predetermined, the dimensions, materials, shapes, and relative configuration of constituent parts described in the embodiments are not intended to be imitative in the scope of the invention.

Embodiment of Television Set

Figure 11:
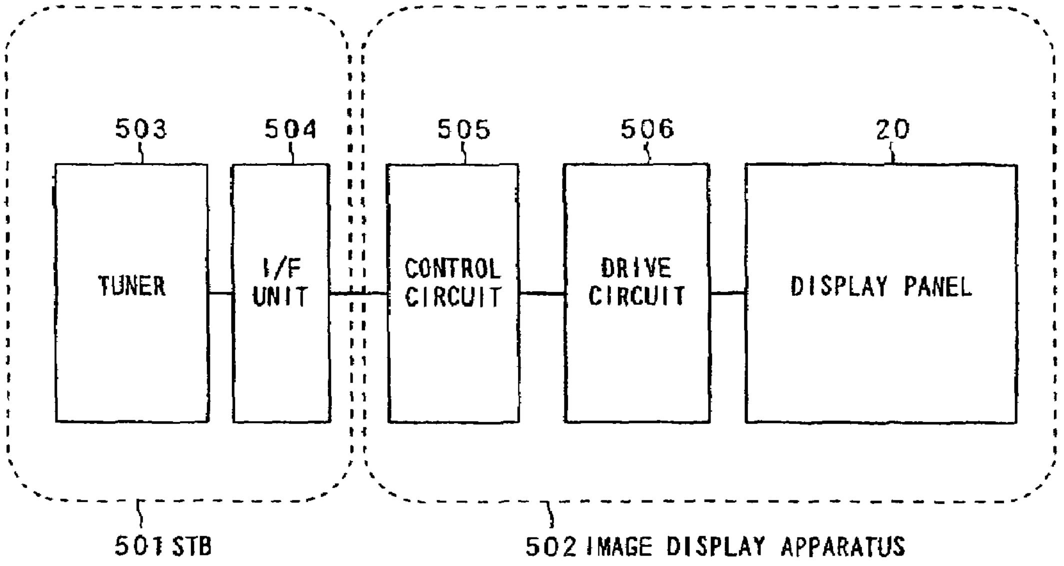
FIG. 11 is a block diagram of a television set according to the invention.

A television set to which the invention is applied is described by referring to FIG. 11. FIG. 11 is a block diagram of the television set according to the invention. The television set comprises a set top box (STB) 501 and an image display apparatus 502.

The set top box (STB) 501 includes a tuner 503 and an I/F unit 504. The tuner 503 receives a television signal of satellite broadcast or ground wave, data broadcast via a network, and the like, and outputs decoded video data to the I/F unit 504. The I/F unit 504 converts the video data into a display format of the image display apparatus 502, and outputs image data to the image display apparatus 502.

Figure 2:
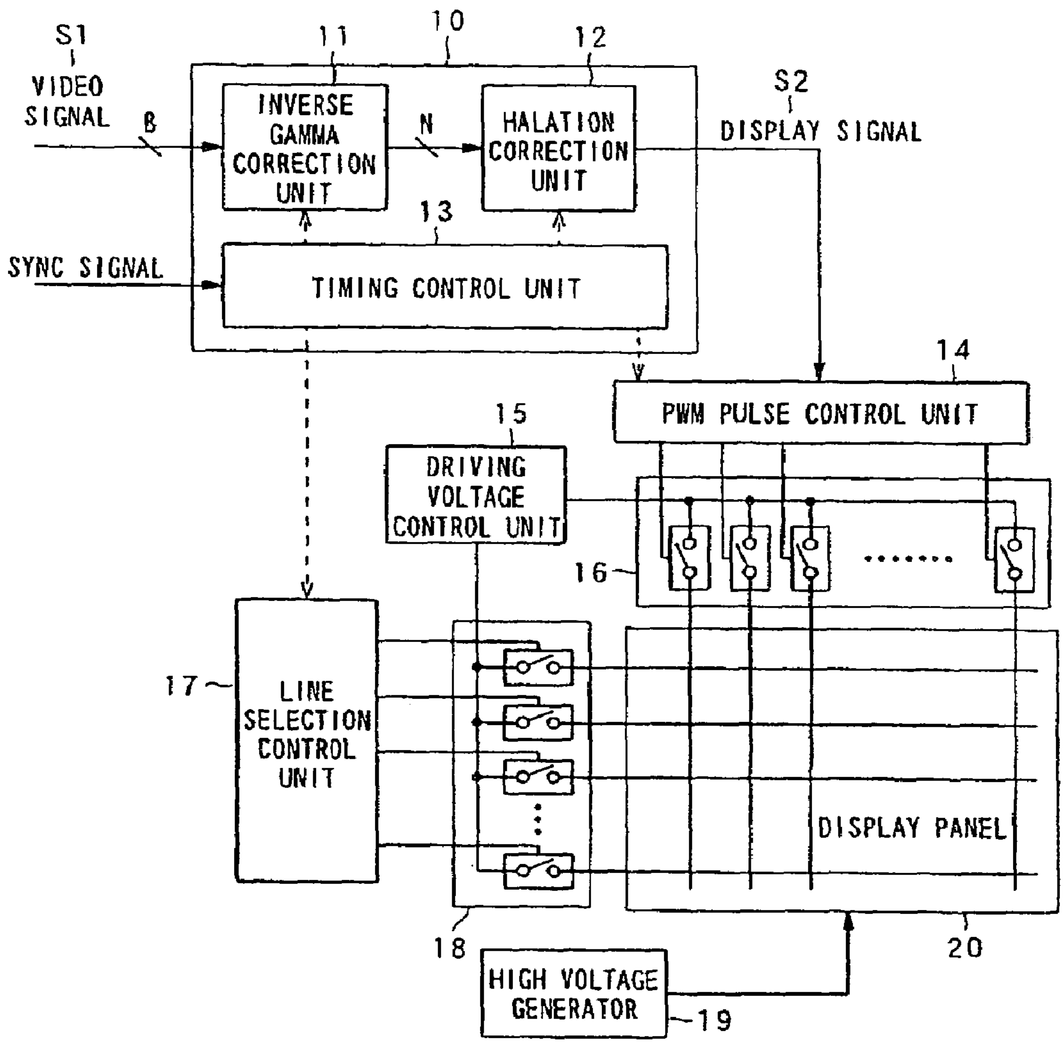
FIG. 2 is a block diagram showing an image display apparatus according to the invention.

The image display apparatus 502 includes a display panel 20, a control circuit 505, a drive circuit 506, and a correction circuit (signal processing unit) of the invention. An image signal decoded into a synchronous signal and the video signal from the I/F unit 504 is inputted in the correction circuit. That is, a signal processing unit 10 in FIG. 2 is connected to the I/F unit 504 in FIG. 11, and a signal from the I/F unit 504 is inputted into the signal processing unit 10 in FIG. 2.

The control circuit 505 included in the image display apparatus 502 outputs image data and various control signals to the drive circuit 506. Examples of the control circuit 505 include a PWM pulse control unit 14 and a driving voltage control unit 15 in FIG. 2. The drive circuit 506 outputs the driving signal to the display panel 20 on the basis of the inputted image data, and a television picture is displayed on the display panel 20. Examples of the drive circuit 506 include a row wiring switch unit 16 and a line wiring switch unit 18 in FIG. 2. As the display panel 20, an SED panel is shown in the following embodiments by way of example.

The tuner 503 and I/F unit 504 may be assembled in other casing than the image display apparatus 502 as the set top box (STB) 501, or may be assembled in the same casing as the image display apparatus 502.

First Embodiment

A first embodiment of the invention will be explained. The image display apparatus of the invention includes an SED display device, an FED display device, a liquid crystal display device, a plasma display device, an organic EL display device, etc. In particular, an electron ray display device such as an SED display device or an FED display device is preferred in the invention because of possibility of causing halation emission in peripheral pixels by raster luminance of luminescent spot with own emission.

Further, in the plasma display device as well, if there is no partition wall between discharge cells or if a partition wall structure becomes larger than a pixel unit, there is a possibility of causing halation (cross talk) in peripheral pixels, and hence it is also preferable in the invention.

Referring to FIG. 2, a configuration of the image display apparatus of the embodiment will be described. Reference numeral 20 is a display panel. In this embodiment, an SED panel is used which comprises, in a thin vacuum container, a multi-electron source in which multiple electron sources, for example, electron emitting devices such as cold cathode devices are arrayed on a substrate, and a confronting image forming member for forming an image by radiation of electrons. The electron emitting devices are wired in a passive matrix by line wiring electrodes and row wiring electrodes, and electrons emitted from devices selected by row/line electrode bias are accelerated by high voltage and collided against a phosphor to obtain light emission. The configuration and manufacturing method of the SED panel are specifically disclosed in Japanese Patent Application Laid-Open No. 2000-250463.

Operation until display after input of a video signal in the SED panel is explained. Signal Sa is an input video signal, which is signal-processed properly for display in the signal processing unit 10, and signal S2 is produced as a display signal. In FIG. 2, the function of the signal processing unit 10 relates to a function block of minimum required limit for explanation of the embodiment.

Reference numeral 11 in the signal processing unit 10 is an inverse gamma correction unit. In general, the input video signal S1 is supposed to be displayed in a CRT display device, and is transmitted or recorded after nonlinear conversion such as 0.45 square called gamma conversion conforming to the input-emission characteristic of CRT display. When the video signal is shown in a display device having a linear input-emission characteristic such as SED, FED, PDP, or LCD, the input signal must be processed by inverse gamma conversion such as 2.2 square. The input signal S1 to the inverse gamma correction unit 11 are often inputted in 8 to 10 bits in each color. However, in order to avoid black-out of low gradation portions due to nonlinear inverse gamma conversion, the signal S1 is converted after increasing the data quantity to 12 bits to 14 bits, in general. Output data of the inverse gamma correction unit 11 is converted into a system in which a display panel luminance and data are linear, and is inputted into a halation correction unit 12 as a correction circuit which is a characteristic portion of the embodiment. The halation correction unit 12 will be described later in more details.

An output from the halation correction unit 12 is outputted as a display signal S2 of an optimum picture for the SED. A timing control unit 13 generates and outputs various timing signals for operation of each block, on the basis of a synchronous signal transferred together with the input video signal S1.

Reference numeral 14 is a PWM pulse control unit, which converts the display signal S2 into a driving signal (PWM modulation in this example) corresponding to the display panel 20 in every horizontal period (line selection period) Reference numeral 15 is a driving voltage control unit, which controls voltage for driving the devices disposed in the display panel 20. Reference numeral 16 is a row wiring switch unit, which is composed of switching means such as a transistor, and operates to apply a driving output from the driving voltage control unit 15 to panel row electrodes for a PWM pulse period outputted from the PWM pulse drive unit 14 in every horizontal period (line selection period). Reference numeral 17 is a line selection control unit, which generates a line selection pulse for driving the devices on the display panel 20. Reference numeral 18 is a line wiring switch unit, which is composed of switching means such as a transistor, and operates to output the driving output of the driving voltage control unit 15 depending on the line selection pulse outputted from the line selection control unit 17 to the display panel 20. Reference numeral 19 is a voltage generator, which generates an acceleration voltage for accelerating the electrons emitted from the electron emitting devices arranged in the display panel 20 to collide against the phosphor. In this configuration, the display panel 20 is driven and a picture is displayed.

As a characteristic portion of the invention, the halation correction unit 12 will be specifically described below with reference to the drawings.

Figure 1:
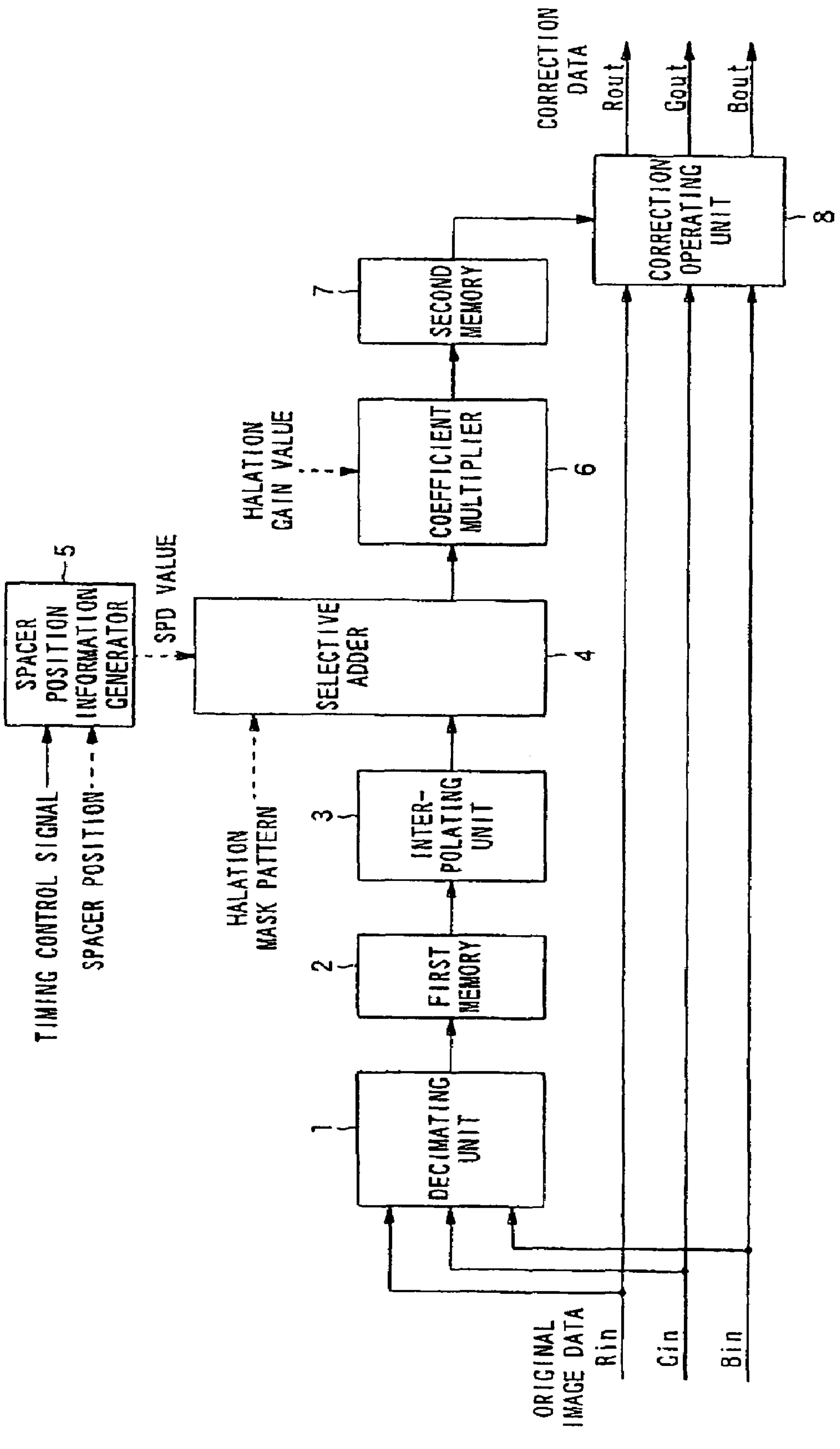
FIG. 1 is a block diagram showing a halation correction unit according to the invention.

Prior to explanation of the halation correction unit 12 in FIG. 1, halation correction is described.

Figure 3B:
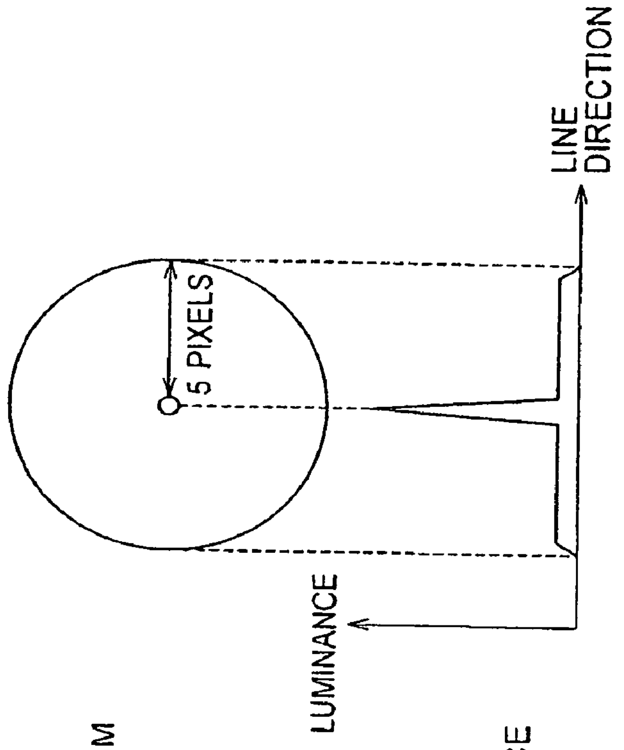
FIGS. 3A and 3B are explanatory diagrams each showing a halation occurrence mechanism remote from a spacer.
Figure 3A:
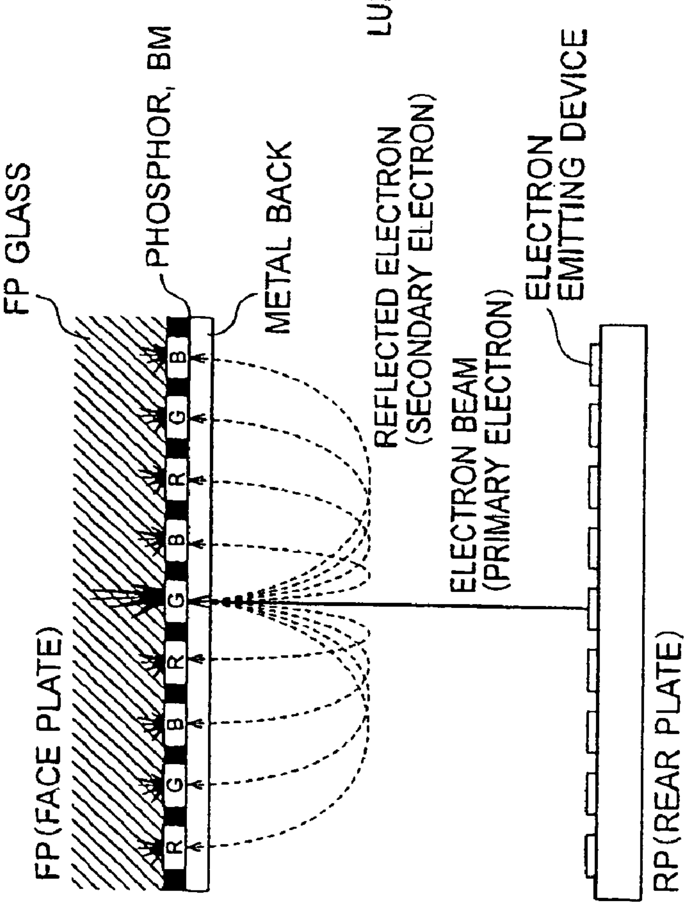

The present inventor has experimented an image display apparatus for emitting a luminous body by radiating the luminous body with an electron beam (primary electron) emitted from the electron emitting devices, by use of electron emitting devices formed on a rear plate, and a luminous body (in this example, phosphors of red, blue and green colors) disposed on a face plate at an interval against the electron emitting devices as shown in FIG. 3A, and has discovered that a specific problem that color reproducibility is different from a desired state occurs. More specifically, for example, when desired to obtain a blue emission by radiating only the blue phosphor with electrons, instead of a pure-blue light, an emission state slightly tinted with other colors (green and red) was obtained, that is, the emission state was not satisfactory in chroma saturation. The inventor has further accumulated studies and found out the saturation lowering causes as follows: primary electrons emitted by the electron emitting devices get into the luminous body corresponding to the electron emitting devices, whereby the corresponding luminous body emits light by a luminescent spot, and at the same time by reflecting by the luminous body, reflected electrons (secondary electrons) get into a light emitting region of different color in the vicinity (including adjacent regions), whereby the peripheral luminous bodies also emit light. Such light emission by the reflected electrons (secondary electrons) is called halation.

Figure 5:
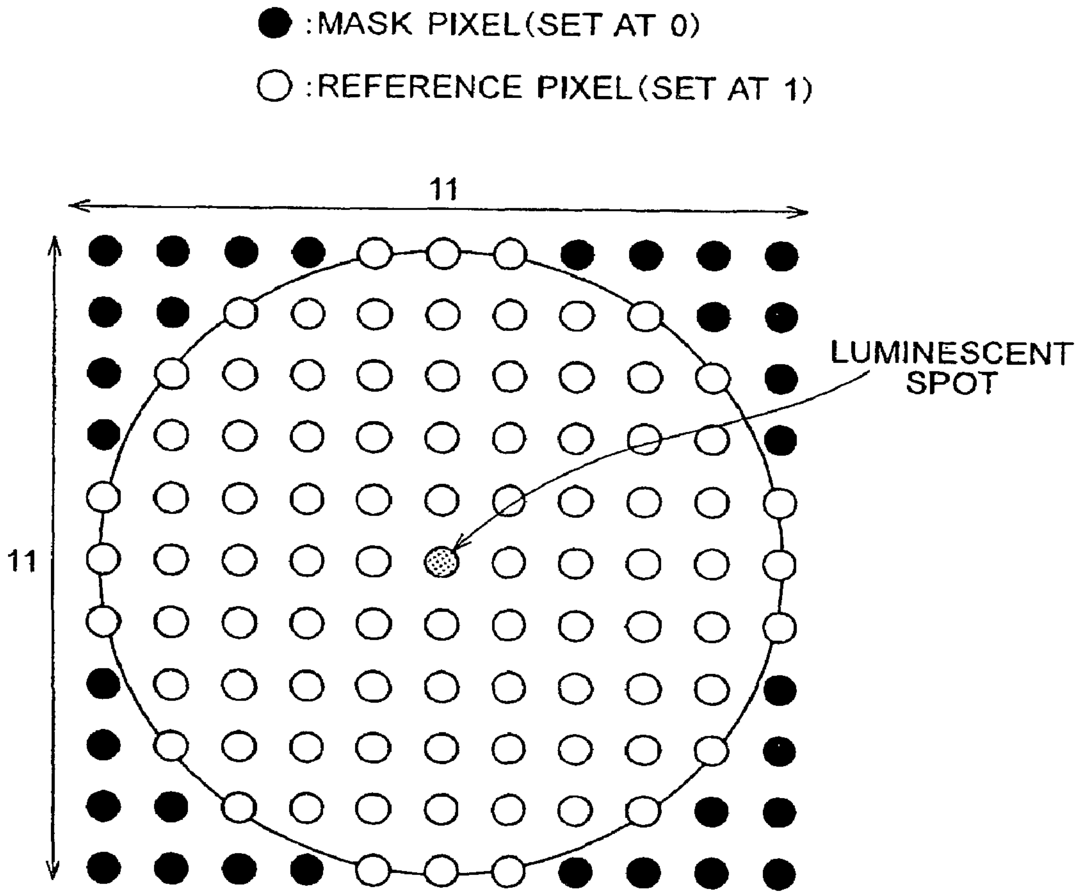
FIG. 5 is a diagram showing a halation mask pattern of 11×11.

In the SED, as shown in FIG. 3B, it is known that, when an electron is emitted to a certain phosphor, a circular light emission (distribution in a circular column centered on the luminescent spot as expressed by the luminance as the emission amount) occurs due to halation in the center of the pixel. If the radius of the circular region effected by halation is n pixels, a filter of 2n+1 taps should be required as a pixel reference range for correction processing. Further, the radius of the range effected by halation is determined uniquely by the interval of the face plate on which the phosphor is disposed and the rear plate on which the electron source is disposed, the pixel size, and the like. Therefore, when the interval of the face plate and the rear plate is known, the number of filter taps is determined uniquely. Since n=5 in the embodiment, it is required to refer to data of 11 pixels× 11 lines, as shown in FIG. 5, in order to consider the degree of effect of an 11-tap filter, that is, the effect of halation.

Figure 4A:
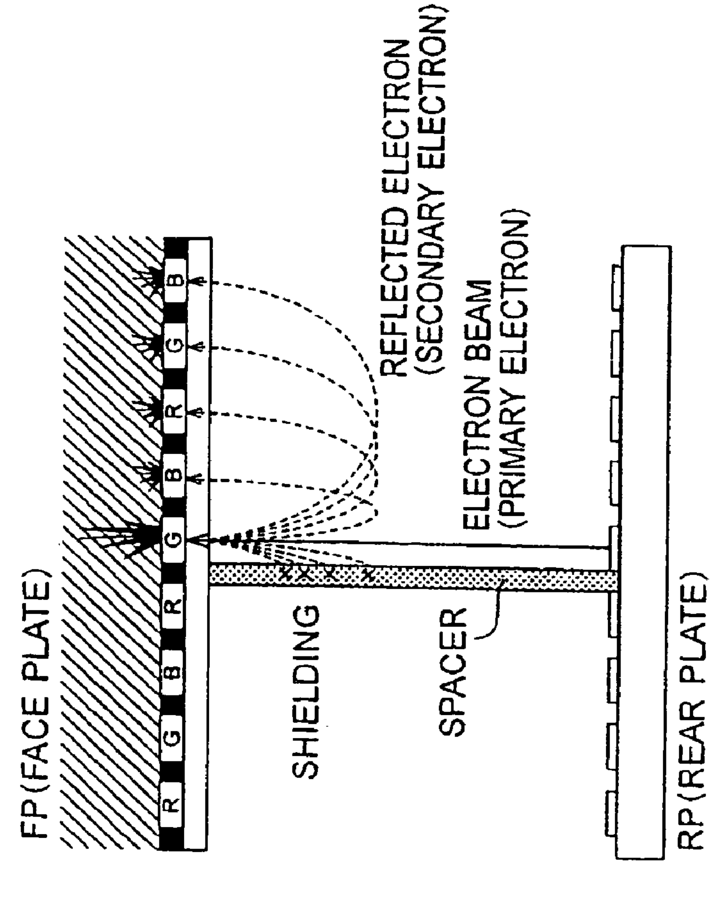
FIGS. 4A and 4B are explanatory diagrams each showing a halation occurrence mechanism near the spacer.
Figure 4B:
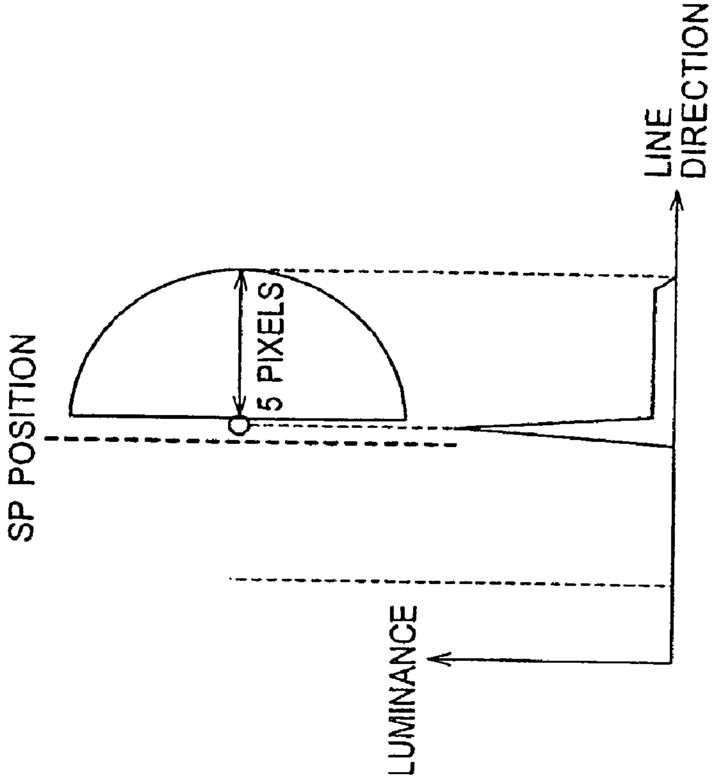

In FIGS. 3A and 3B, no shielding member such as a spacer is provided on the reflection track of reflected electrons (remote from the spacer) However, when there is a shielding member such as a spacer (near spacer), reflected electrons (secondary electrons) are shielded by the spacer as shown in FIG. 4A, and thus, halation intensity is decreased. As a result, it has been found that, when electron beams (primary electrons) are emitted from the electron emitting devices closest to the spacer, the halation effective range becomes semicircular emission as shown in FIG. 4B.

The above-described operation is a mechanism of occurrence of halation explained by referring to an example at the time of light emission from one device.

Figure 8A:
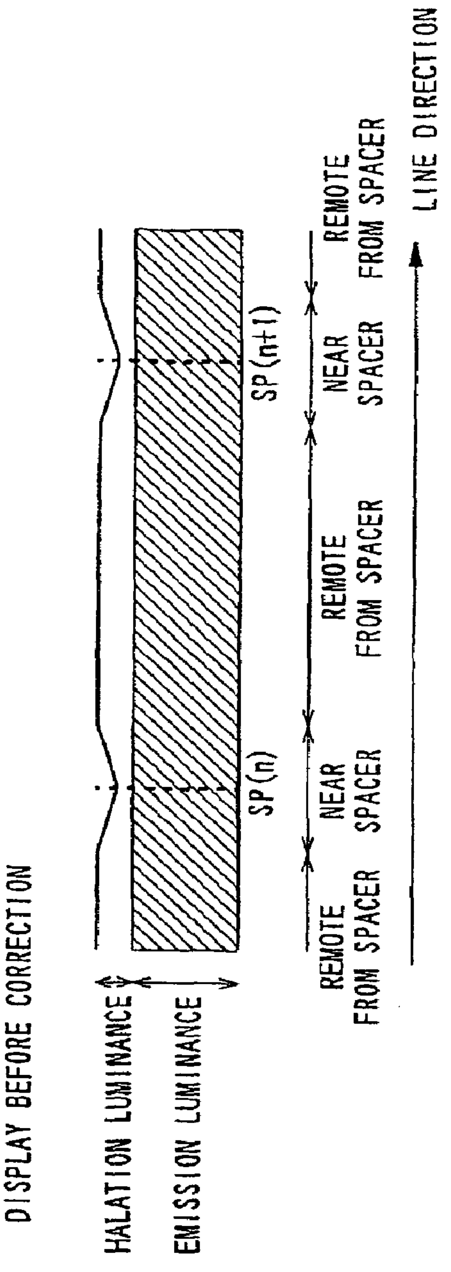
FIGS. 8A and 8B are image diagrams of halation correction by addition according to a first embodiment of the invention.

Actually, the SED has a plurality of spacers mounted in the line direction at every several lines. When the same colors on the entire surface are lit, there occurs a difference in halation quantity between two different regions near the spacer and remote from the spacer by the halation, and it has been verified that the area near the spacer has a specific problem of spacer irregularity changing in colorimetric purity. A difference in spacer irregularity varies with a lighting pattern of a display image. For example, in the case of overall blue lighting, as shown in FIG. 8A, halation luminance is added to the blue emission luminance, and the area near the spacer gradually changes in shielding quantity of reflected electrons, so that gradual wedge-like changes of colorimetric purity are visually recognized in a width of about 10 lines.

As a result of strenuous efforts, the inventor has discovered a correction circuit for a driving signal in a novel image display apparatus capable of solving these problems. A specific example of the invention will be described below while referring to FIG. 1. Original image data in FIG. 1 is an output from inverse gamma correction unit 11, which is supposed to be inputted in N bits each. As mentioned above, in order to correct in consideration of the halation effective range, a filter of 11×11 taps is required, and a memory of at least 11 lines is required for arithmetic processing.

In this example, the line memory quantity required for correction is estimated as follows.

Line memory capacity=number of horizontal pixels×N bits×RGB×11 lines In the case of high gradation display in the condition of number of horizontal pixels=1920 pixels, N=14 bits full HD, RGB=3, the required line memory capacity for correction is a tremendous quantity, that is, 1920×14×3×11=878 Kbits. It is easy to understand for those skilled in the art that the chip cost is increased remarkably when an arithmetic memory of such huge quantity is directly mounted in the LSI for signal processing.

A configuration for curtailing the line memory capacity for correction as a characteristic portion of the embodiment is explained by referring to FIG. 1.

In a decimating unit 1, the original data quantity is decreased, and transferred to a first memory 2. The original data quantity can be decreased by two methods.

In one method, arithmetic data refers to upper m bits of n bits (n>m) of original data, and the value of m is determined so as to settle within an error rate not lowered in the arithmetic precision of halation correction, and thereby the number of reference bits is curtailed. In the case of halation correction, it has been clarified by experiment that the bits can be curtailed to m=8 bits when the output of the inverse gamma correction unit 11 is in a range of n=12 bits to 14 bits. The reason is that since the halation quantity is calculated by multiplying a specific infinitesimal coefficient among the total lighting quantity of reference pixels, the resolution of reference pixels is determined depending on this infinitesimal coefficient.

In the other method, the halation effective range is approximated in pixel unit, instead of RGB sub-pixel unit. More specifically, lighting quantities of RGB sub-pixels are added, such as Pixel (m+2 bits)=R (m bits)+G (m bits)+B (m bits), and represented as the total lighting quantity of pixels. RGB sub-pixels are minimum pixels, and a plurality of minimum pixels, that is, a set of three RGB is handled as one pixel. However, the handling unit of one pixel is not particularly predetermined, for example, each one of R, G, B may be handled as one pixel.

By these two methods of decreasing the original data, the value of N in the above formula becomes N=(m/n)×((m+2)/3m)=(8/14)×(10/24)=0.24, and the capacity of first memory 2 can be curtailed by 24%, from 887 Kbits to 213 Kbits, without lowering the correction precision.

An output from the decimating unit 1 is sequentially written into the first memory 2 composed of a 11-line memory in line unit. When data of the portion of 11 lines is stored, data of 11 pixels×11 lines is read out simultaneously from the 11-line memory for arithmetic reference. Since the first memory 2 is desired to have such configuration for allowing simultaneous reading, it is preferred to compose the line memory in SRAM configuration. It is hence desired to use a RAM in the LSI such as ASIC or FPGA. Data of 11 pixels×11 lines read out simultaneously is multiplied by $2^{n-m}$ times by the portion subtracted by an interpolating unit 3.

Reference numeral 4 is a selective adder, which masks data of 11 pixels×11 lines by a halation mask pattern showing information of peripheral pixels having effects as reflected electrons shown in FIG. 5 (pixel quantity in a mask region is 0).

Figure 6:
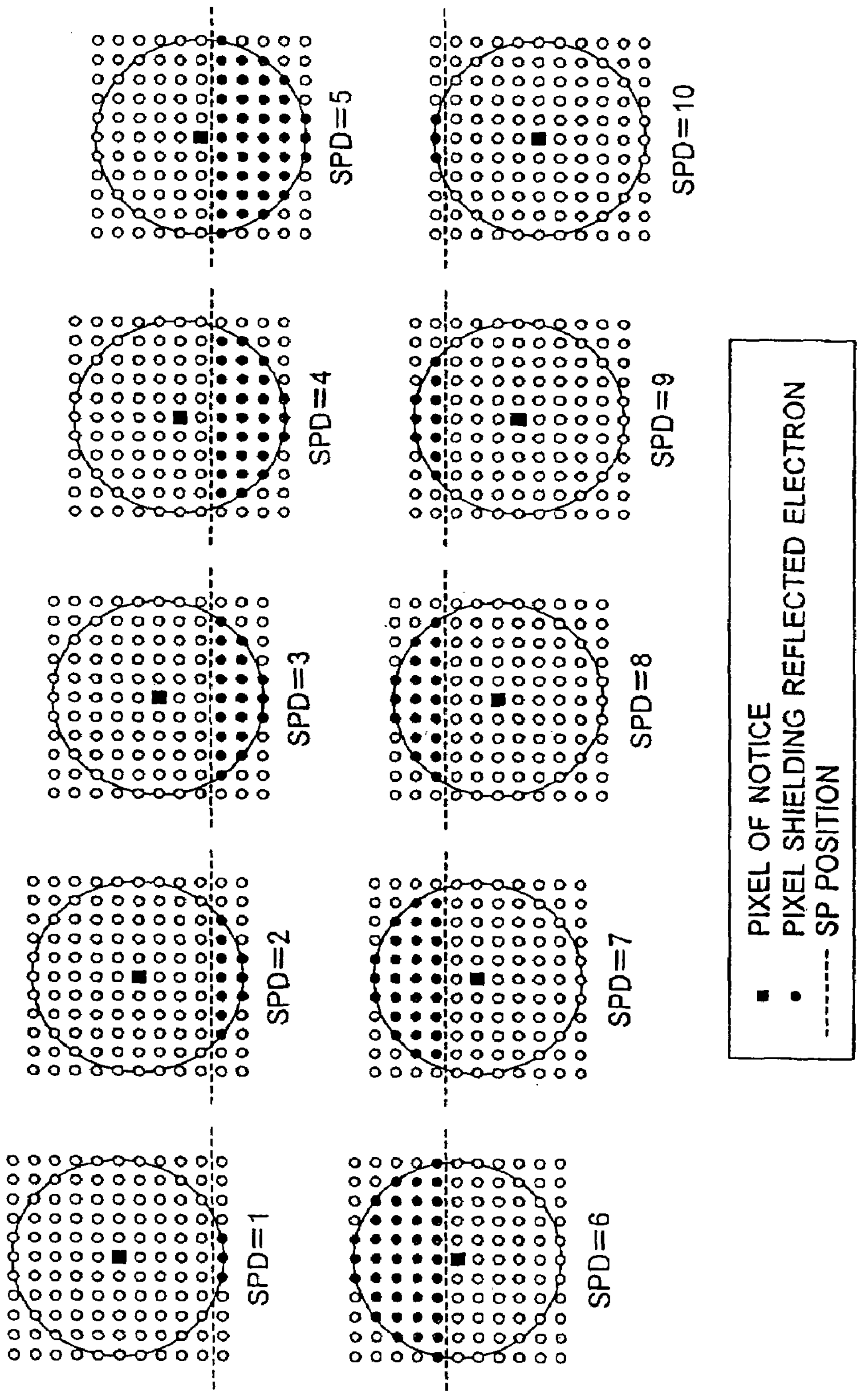
FIG. 6 is a corresponding diagram of a pixel region at which reflected electrons are shielded depending on a distance between a pixel of notice and the spacer.

In the pixel of notice near the spacer, only the portion of reflected electrons from the peripheral pixels shielded by the spacer is added selectively. Whether the pixel of notice is near the spacer or not is determined by a spacer position information generator 5 on the basis of SPD value (spacer distance) showing the positional relation between the pixel of notice and the spacer generated on the basis of a timing control signal received from the timing control unit 13 and spacer position information. Pixels corresponding to reflected electrons shielded by the pixel of notice near the spacer are available in 10 patterns of the SPD value as shown in FIG. 6, and the total lighting quantity relating to the shielding quantity can be determined by selecting pixel values indicated in black circle depending on the SPD value and adding them all. Remote from the spacer, since shielding of reflected electrons by the spacer does not occur, the result of addition may be 0.

Reference numeral 6 is a coefficient multiplier, which multiplies by a coefficient (halation gain value) showing how much percent of the addition result is the shielded halation portion (suppression amount). The coefficient is usually a value somewhere between 0 and 1, and it is about 1.5% in an actual panel. A correction value calculated by the coefficient multiplier 6 is stored in a second memory 7.

The role of the second memory 7 is to adjust the calculated correction value at the timing corresponding to the predetermined pixel position of original image data not passing through the first memory 2, and in this configuration, it is a frame buffer for storing the correction value in order to delay by one frame. Since the second memory 7 functions as a timing adjusting buffer, it is preferred to use an inexpensive device such as external DRAM.

The correction value read out from the second memory 7 one frame later is added to the original image data by a correction operation unit 8, and outputted as correction data as follows:

Rout=Rin+correction value,

Gout=Gin+correction value, and

Bout=Bin+correction value.

Figure 8B:
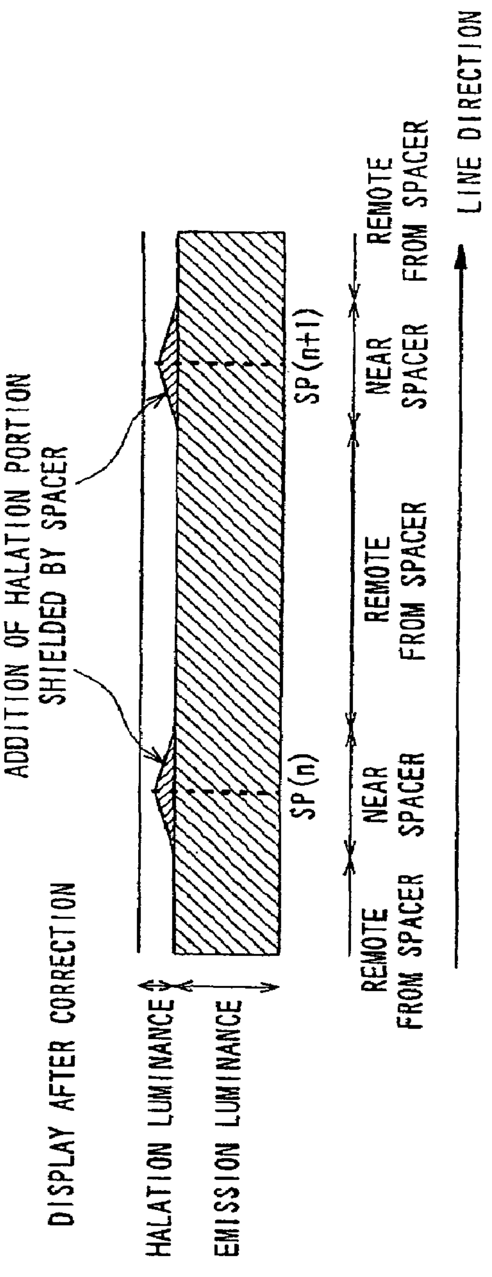

As explained above, it is intended to correct in a separate configuration of the first memory 2 and the second memory 7 such that the cost may be saved without lowering the correction precision. By employing such a method, adverse effects by reflecting the correction data one frame later are suspected, but are not observed visually in experiment, and favorable correction results have been obtained. It is partly because there is a strong correlation in normal pictures between frames, and a difference in delay of one frame cannot be often detected, and even if there is a picture of weak frame correlation (such as a picture in which a white rectangular region moves in one frame unit in the black background), the halation correction amount is as small as about 1.5% of luminance of the luminescent spot as explained above, and it is beyond the detection limits of the human eye concerning luminance changes as a correction error. Hence, before correction as shown in FIG. 8A, gradual changes of colorimetric purity near the spacer are as shown in FIG. 8B, in which halation is added to the portion of the shielded reflected electron near the spacer, and, a difference in colorimetric purity remote from and near the spacer is decreased on the whole screen, so that spacer irregularity due to halation can be corrected.

Thus, the invention is intended to solve the problem of the prior art that, when original data is inputted into a signal route for determining a correction value, original image data is also decimated due to decimating process, so that a favorable image may not be obtained. In the invention, accordingly, the signal route of original image data and the signal route for determining a correction value are separated, and concurrently, timing delay occurs. Therefore, by adjusting the timing by the second memory, favorable correction operation of the original image data and the correction value is realized, so that a favorable image is obtained.

In the embodiment, the correction value is added to the original image data. Not limited to this example, however, in another example, the correction value may be stored as gain, and the correction value may be multiplied by the original image data. That is, in a configuration in which, in the case where image data demanding uniform brightness in all pixels (input image data corresponding to each pixel having the same value) is inputted, the brightness near the shielding member is smaller than the brightness remote from the shielding member because of the presence of the shielding member, various modes may be employed the pixel data corresponding to pixels near the shielding member is corrected to be relatively larger than the pixel data corresponding to pixels remote from the shielding member, so that the difference in brightness can be smaller between an area near the shielding member and an area remote from the shielding member.

Second Embodiment

Figure 9A:
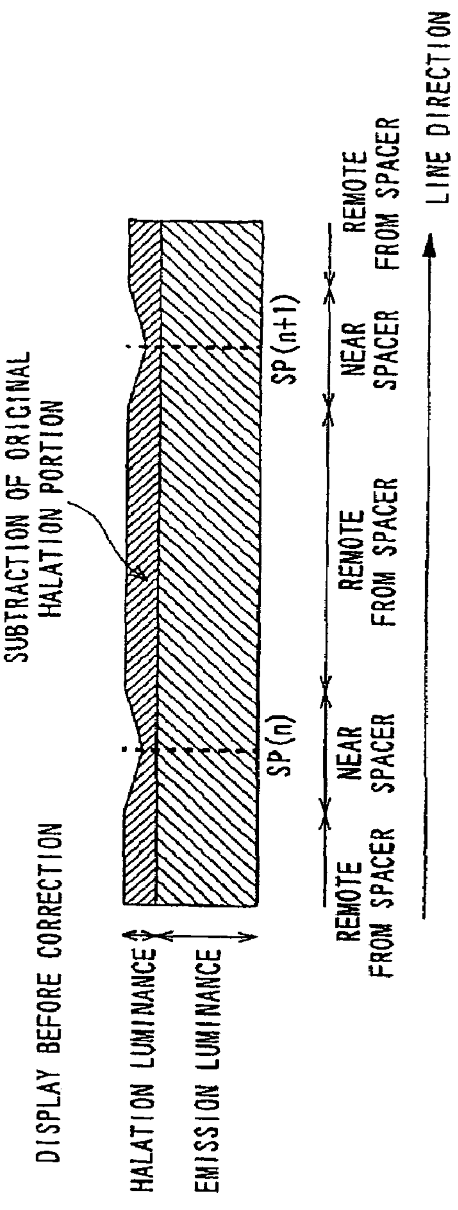
FIGS. 9A and 9B are image diagrams of halation correction by subtraction according to a second embodiment of the invention.
Figure 9B:
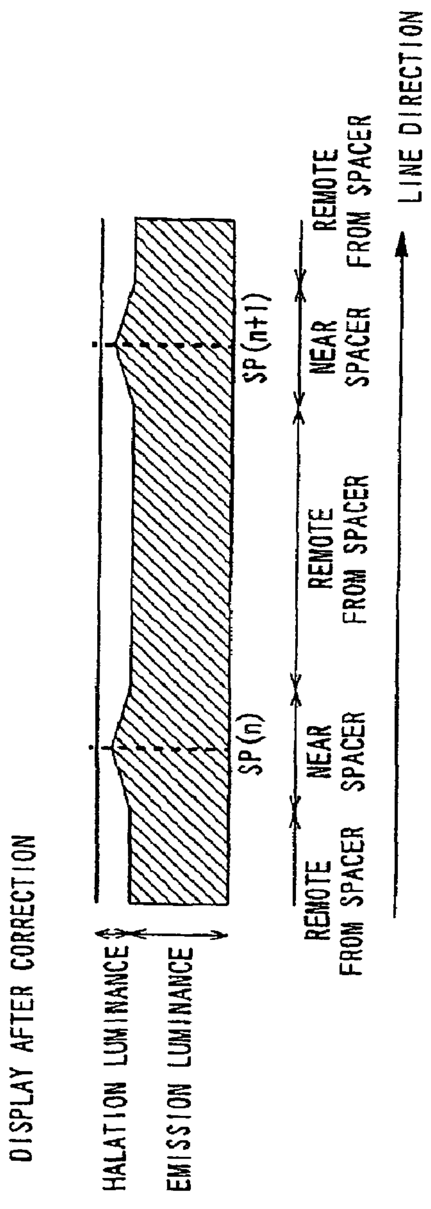

In the first embodiment, spacer irregularity is corrected by estimating reflected electrons shielded by the spacer in a region near the spacer, and adding the halation portion (suppression amount) of the shielded portion. In this embodiment, as shown in FIG. 9A, by estimating original halation portions (effect amounts) existing remote from the spacer and near the spacer and subtracting from the original image data, unevenness including spacer irregularity is corrected as shown in FIG. 9B. In this embodiment, since the configuration of the first embodiment can be similarly applied, only different points from the first embodiment are explained below.

Figure 7:
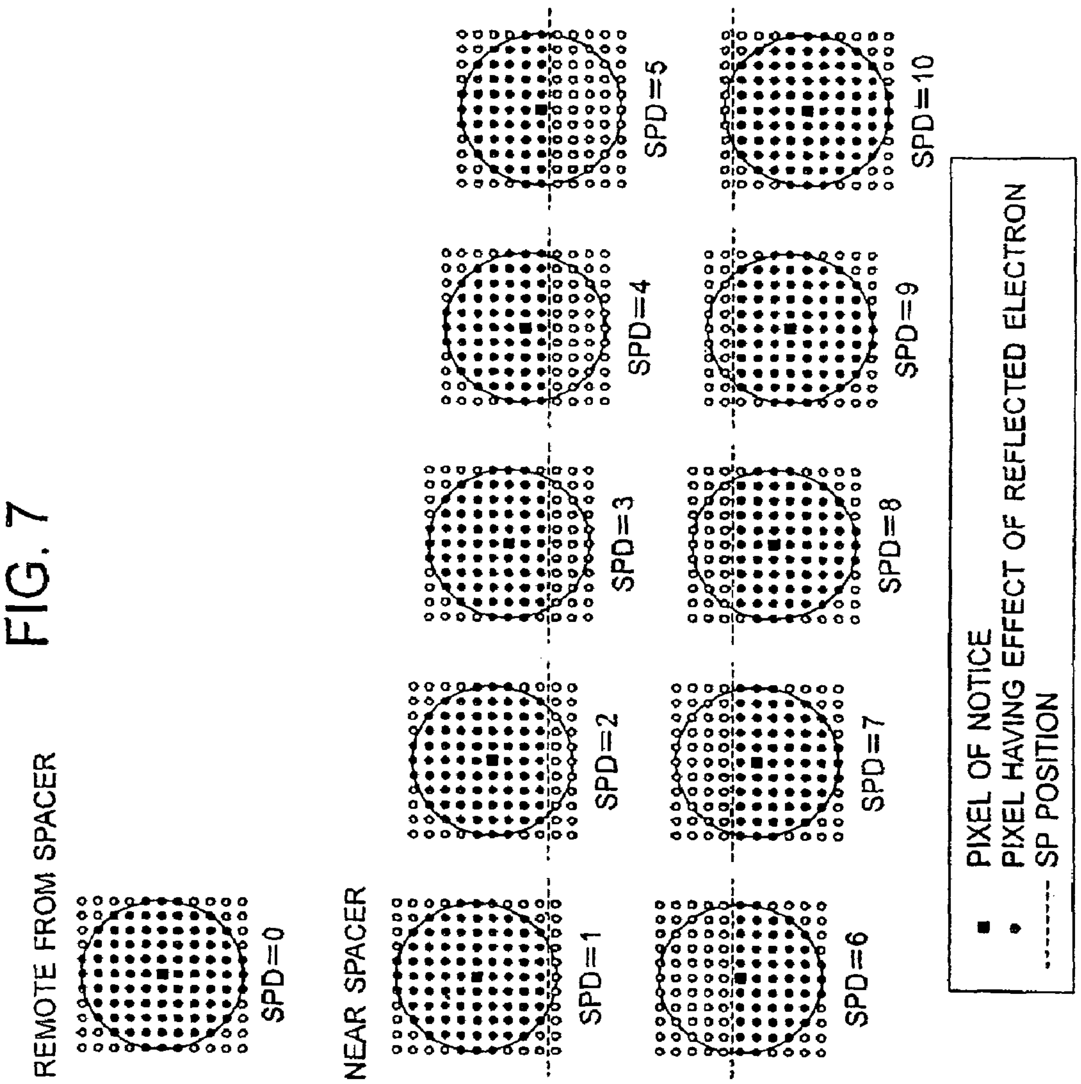
FIG. 7 is a corresponding diagram of a pixel region at which reflected electrons effect depending on a distance between a pixel of notice and the spacer.

What differs from the first embodiment lies in the internal processing of the selective adder 4 as shown in FIG. 7, in which there are 11 patterns depending on SPD values, pixel values in black circle are selected by SPD values (SPD=0 remote from the spacer, and SPD=1 to 10 near the spacer), and by adding them all, the original halation portion is estimated. By composing the filter pattern in this manner, it is possible to integrate pixel data (decimated) of peripheral pixels where effects are not shielded by the spacer. The embodiment is also intended to correct the increment of brightness of predetermined pixels by driving of peripheral pixels. Hence, the correction value read out from the second memory 7 one frame later is subtracted from the original image data by the correction operation unit 8, and outputted as correction data as follows:

Rout=Rin−correction value,

Gout=Gin−correction value, and

Bout=Bin−correction value.

The other operation is same as in the first embodiment.

Therefore, in this embodiment as well, a configuration in which the correction in FIG. 1 is separated in the first memory and second memory can be applied in the same manner as in the first embodiment. Accordingly, the cost can be lowered without dropping the correction precision, and the same effects as in the first embodiment are obtained. In this embodiment, unevenness due to effects of halation remote from the spacer can be corrected. The embodiment is hence applicable in a configuration having no shielding member for locally varying the mutual effects of pixels in a display region. Since the embodiment can correct unevenness remote from the shielding member and also adjust the degree of correction near the shielding member, it is designed to correct unevenness properly even near the shielding member. However, since the correction is intended to decrease the effect for increasing display gradation by driving of peripheral pixels, the correction is limited when the original image data is smaller than the correction value. When the original image data is larger than the correction value, perfect correction is possible including the area remote from the shielding member.

Third Embodiment

The first and second embodiments have been described the method of curtailing the original image data by the decimating unit 1, but both the cases are intended to refer to all pixels of original image data consisting of 11 pixels×11 lines. In this embodiment, in order to further curtail the memory capacity, a line decimation method is explained by referring to FIG. 10.

Figure 10A:
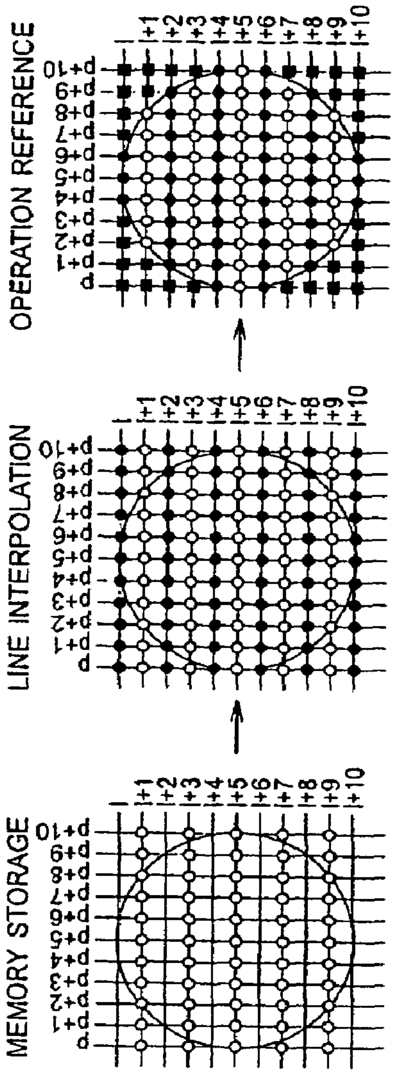
FIGS. 10A and 10B are explanatory diagrams of halation correction by ½ line decimation according to a third embodiment of the invention.

In decimation control unit 1, lines are decimated after curtailing the original data in the method explained in the first embodiment. More specifically, as shown in FIG. 10A, data of odd-number lines only (1+1, 1+3, 1+5, 1+7, 1+9) is written into the first memory 2 by interlacing control.

Therefore, odd-number line data of the portion of five lines is stored in the first memory 2. At a time point at which the five-line data are stored, data of 11 pixels×5 lines is read out from the five-line memory for operation reference. In the interpolating unit 3, the amount decreased in the first embodiment is multiplied by $2^{n-m}$ times, and also decimated data of even-number lines (1, 1+2, 1+4, 1+6, 1+8, 1+10) is interpolated and reproduced by estimation.

As an example of this line interpolation method, there is a method of determining by linear interpolation from original pixels of upper and lower lines of the pixel to be interpolated. For example, to determine the interpolation pixel value D (p+2, 1+2) at position of (p+2, 1+2), it is obtained by a simple calculation of D (p+2, 1+2)=(D (p+2, 1+1)+D (p+2, 1+3))/2. Such a line interpolation method is not limited to this linear interpolation method, but other general methods may be applied, such as a cubic interpolation method referring to the range of peripheral 4×4 of interpolation pixels, or a nearest neighbor interpolation method.

An output of the interpolating unit 3 is put into the selective adder 4 as data of the portion of 11 pixels×11 lines. Subsequent process is same as in the first embodiment.

Figure 10B:
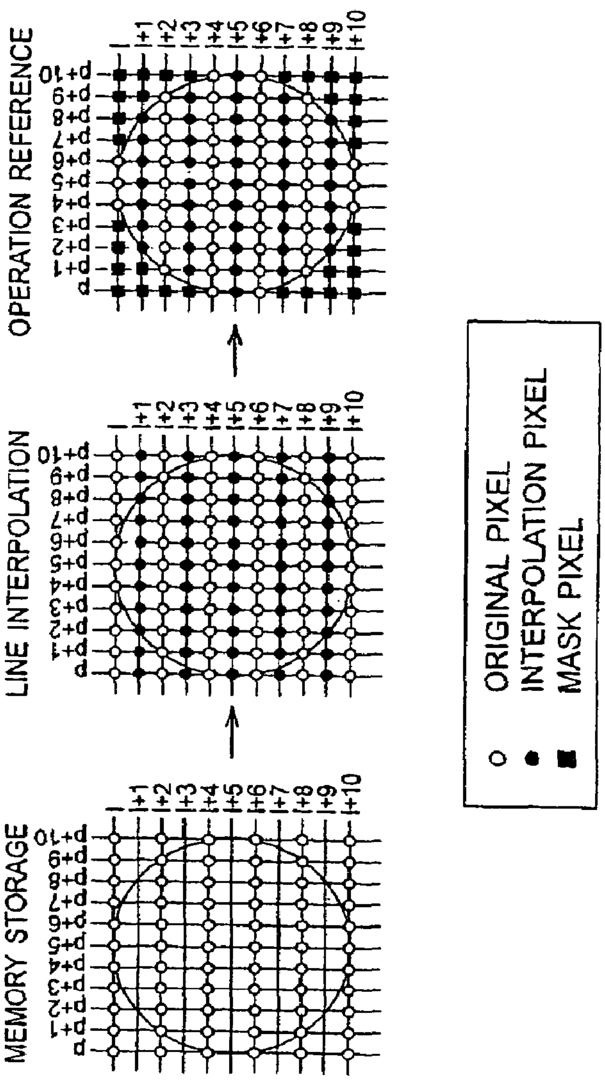

In the frame period of the above explanation, odd line data is taken in and even lines are interpolated. However, the next frame is preferred to process as shown in FIG. 10B, that is, even line data is taken in, odd lines are interpolated, and thereafter the decimating pattern is toggled between odd number and even number in every frame. The reason is that correction performance is less likely to be lowered by repeated correction when the reference pixels are smoothed rather than interpolating always the same lines.

Thus, by decreasing the original image data by line decimation, the line memory capacity can be further curtailed to about 50% of that of the first embodiment.

The embodiment has described decimation in the line direction, but decimation may be also applied in the pixel direction. Further, it is evident that the capacity can be curtailed to 25% when decimated in both the line direction and pixel direction.

The embodiment can be also realized in a separate configuration of the first memory 1 and the second memory 7 as shown in FIG. 1, and therefore, the cost is further saved as compared with the first and second embodiments.

This application claims priority from Japanese Patent Applications No. 2004-191824 filed Jun. 29, 2004, and No. 2005-165552 filed Jun. 6, 2005, which are hereby incorporated by reference herein.

What is claimed is:

1. A correction circuit for correcting pixel signals, comprising:

a first memory for storing signals obtained by executing decimation process to a plurality of pixel signals sequentially inputted as pixel signals corresponding to a plurality of peripheral pixels positioned in the vicinity of a predetermined pixel on a predetermined screen;

a calculating circuit for calculating a correction value based on an output from the first memory;

a second memory for adjusting a timing of output of the correction value so as to correct a pixel signal which is for forming the predetermined pixel on a screen after the predetermined screen and which does not pass through the first memory, by the correction value corresponding to the predetermined screen; and an operating circuit for operating to correct the pixel signal which is for forming the predetermined pixel on a screen after the predetermined screen and which does not pass through the first memory, by the correction value corresponding to the predetermined screen, wherein the correction value has a value corresponding to a suppressing amount for which an influence on display gradation of the predetermined pixel by the plurality of peripheral pixels is suppressed, and wherein the suppressing is caused by a shielding member possessed by a display panel for displaying images by pixel signal.

2. A correction circuit according to claim 1, wherein the decimation process is a decimation process of referring to only a predetermined upper bit of the pixel signal which is subjected to the decimation process.

3. A correction circuit according to claim 1, wherein the decimation process is a decimation process of approximating in each of a plurality of pixels.

4. A correction circuit according to claim 1, wherein the decimation process is a process of decimating a plurality of pixels arranged in the horizontal direction and/or vertical direction by skipping every line, and the calculating circuit generates a decimated pixel after the output from the first memory by interpolating from the peripheral pixels to execute the calculation.

5. A correction circuit according to claim 4, wherein the decimation process exchanges a decimated pixel and a non-decimated pixel in every screen unit.

6. A correction circuit according to claim 1, wherein the operating circuit operates to add the correction value to the pixel signal which is for forming the predetermined pixel on a screen after the predetermined screen and which does not pass through the first memory.

7. An image display apparatus comprising:

a correction circuit according to claim 1; and a display panel for displaying an image by a pixel signal corrected by the correction circuit.

8. A television set comprising:

a tuner for receiving a television signal; and an image display apparatus according to claim 7, wherein the image display apparatus display an image based on a signal received by the tuner.

9. A correction circuit for correcting pixel signals, comprising:

a first memory for storing signals obtained by executing decimation process to a plurality of pixel signals sequentially inputted as pixel signals corresponding to a plurality of peripheral pixels positioned in the vicinity of a predetermined pixel on a predetermined screen;

a calculating circuit for calculating a correction value based on an output from the first memory, wherein said correction value has a value for correcting an influence on display gradation of the predetermined pixel by the plurality of peripheral pixels;

a second memory for adjusting a timing of outputting the correction value so as to correct a pixel signal which is for forming the predetermined pixel on a screen after the predetermined screen and which does not pass through the first memory, by the correction value corresponding to the predetermined screen; and an operating circuit for operating to correct the pixel signal which is forming the predetermined pixel on a screen after the predetermined screen and which does not pass through the first memory, by the correction value corresponding to the predetermined screen.

10. An image display apparatus comprising:

a correction circuit according to claim 9; and a display panel for displaying an image by a pixel signal corrected by the correction circuit.

11. A television set comprising:

a tuner for receiving a television signal; and an image display apparatus according to claim 10, wherein the image display apparatus display an image based on a signal received by the tuner.

12. An image display apparatus comprising a plurality of electron emitting devices, a luminous body, a spacer, and a correction circuit for correcting pixel signals which drive the electron emitting devices, wherein a pixel is formed as light emission caused by radiating the luminous body with electrons emitted from the electron emitting devices, wherein the correction circuit comprises:

a first memory for storing signals obtained by executing decimation process to a pixel signal corresponding to a pixel positioned on a side opposite to a predetermined pixel across the spacer on a predetermined screen;

a calculating circuit for calculating a correction value based on an output from the first memory;

a second memory for adjusting a timing of output of the correction value so as to correct a pixel signal which is for forming the predetermined pixel on a screen after the predetermined screen and which does not pass through the first memory, by the correction value corresponding to the predetermined screen; and an operating circuit for operating to correct the pixel signal which is for forming the predetermined pixel on a screen after the predetermined screen and which does not pass through the first memory, by the correction value corresponding to the predetermined screen.

13. A television set comprising:

a tuner for receiving a television signal; and an image display apparatus according to claim 12, wherein the image display apparatus displays an image based on a signal received by the tuner.

* * * * *

UNITED STATES PATENT AND TRADEMARK OFFICE

CERTIFICATE OF CORRECTION

PATENT NO. : 7,327,506 B2
APPLICATION NO. : 11/156656
DATED : February 5, 2008
INVENTOR(S) : Hideaki Yui It is certified that error appears in the above-identified patent and that said Letters Patent is hereby corrected as shown below:

<u>COLUMN 3</u>
Line 62, “Sa” should read --S1--.

<u>COLUMN 5</u>
Line 36, “spacer)” should read --spacer).--.

<u>COLUMN 6</u>
Line 8, “In” should begin a new paragraph.

<u>COLUMN 10</u>
Line 64, “display an” should read --displays an--.

<u>COLUMN 11</u>
Line 29, “display an” should read --displays an--.

Signed and Sealed this

Sixteenth Day of December, 2008

JON W. DUDAS
*Director of the United States Patent and Trademark Office*